United States Patent
Limvorapun et al.

(10) Patent No.: US 9,650,137 B2
(45) Date of Patent: May 16, 2017

(54) MOVEMENT DETECTION OF HANGING LOADS

(71) Applicant: The Boeing Company, Chicago, IL (US)

(72) Inventors: Suhat Limvorapun, Huntington Beach, CA (US); John Sumerel, Long Beach, CA (US)

(73) Assignee: THE BOEING COMPANY, Chicago, IL (US)

( * ) Notice: Subject to any disclaimer, the term of this patent is extended or adjusted under 35 U.S.C. 154(b) by 527 days.

(21) Appl. No.: 14/191,742

(22) Filed: Feb. 27, 2014

(65) Prior Publication Data

US 2015/0241198 A1    Aug. 27, 2015

(51) Int. Cl.
*G01L 5/00*     (2006.01)
*B64D 1/22*    (2006.01)
*G01B 5/24*    (2006.01)
*G01R 27/02*   (2006.01)

(52) U.S. Cl.
CPC ............... *B64D 1/22* (2013.01); *G01B 5/24* (2013.01); *G01R 27/02* (2013.01)

(58) Field of Classification Search
USPC .......................... 73/862.56; 244/1 TD, 17.13
See application file for complete search history.

(56) References Cited

U.S. PATENT DOCUMENTS

| | | | | |
|---|---|---|---|---|
| 3,756,543 A | * | 9/1973 | Fowler | G05D 1/0858 244/17.13 |
| 5,152,183 A | * | 10/1992 | Munzebrock | B66C 13/063 73/158 |
| 7,683,564 B2 | | 3/2010 | Harris et al. | |

OTHER PUBLICATIONS

Bud Sauvageau, K-MAX Cargo Unmanned Aerial System, Kaman Aerospace, Oct. 2011.
Ivler et al., Cable Angle Feedback Control Systems to Improve Handling Qualities for Helicopters with Slung Loads, AIAA 2011-6686, AIAA Guidance, Navigation, and Control Conference08—Aug. 11, 2011, Portland, Oregon.

* cited by examiner

*Primary Examiner* — Lam Nguyen
(74) *Attorney, Agent, or Firm* — Duft Bornsen & Fettig, LLP

(57) ABSTRACT

Embodiments described herein provide for detecting an angle of a cable attached to a rotorcraft for transporting a hanging payload using a pair of linear displacement sensors that are coupled to both the rotorcraft and the cable. One embodiment is a cable angle detector mounted to an underside of a rotorcraft. A cable has one end coupled to the rotorcraft and another end coupled to a payload. A pair of linear displacement sensors has one end coupled to the underside of the rotorcraft and another end coupled to the cable. The detector measures the displacement of the sensors and calculates an angle of the cable relative to the rotorcraft based on the measurements.

20 Claims, 5 Drawing Sheets

MOVEMENT DETECTION OF HANGING LOADS

FIELD

This disclosure relates to the field of rotary-wing aircraft and in particular, to load transport utilizing a cable coupled to the rotary-wing aircraft.

BACKGROUND

A rotary-wing aircraft, or rotorcraft, generates lift utilizing rotor blades to propel a heavier-than-air flying machine through the air. Some examples of rotorcraft include helicopters, quad copters, etc. In some cases a cable may be coupled to the rotorcraft for transporting hanging loads. As the rotorcraft travels through the air, the payload at the end of the cable may swing in any direction. However, if the payload position is known relative to the position of the rotorcraft, the payload swing may be reduced utilizing small changes in the movement of the vehicle. It is desirable to minimize the swing of the payload because excessive movement may cause structural stress to the airframe of the rotorcraft and/or excessive power consumption in order to maintain control of the rotorcraft.

One approach for determining the position of the payload relative to the rotorcraft utilizes video camera(s) that capture digital images of the hanging load. The digital images may then be processed to determine the position of the payload relative to the rotorcraft. However, utilizing video cameras may fail in low visibility environments, such as fog, rain, dust, etc., when the payload cannot be visualized by the camera(s). Further, specialized visual markers may have to be applied to the payload in order to accurately locate the payload in the digitized images. When the markers are forgotten, the system may fail with the result being excessive movement of the payload.

Another approach for determining the position of the payload relative to the rotorcraft utilizes an inverted joystick approach. A ball joint is mounted to the rotorcraft and a cable extends from the ball joint to the payload. The ball joint includes a number of sensors that measure the position of the ball joint. The movement of the payload may then be measured utilizing the sensors. However, in this case the ball joint is subject to the full weight of the payload, which may be hundreds or thousands of pounds. This may result in a ball joint having a significant size and weight in order to support the weight of the payload, which also adds weight to the rotorcraft. Further, the complexity of the sensors used to measure the orientation of the ball joint may render the system more prone to failure.

It therefore remains a problem to measure the movement of hanging loads for rotorcraft in a manner that is reliable within a variety of flight environments without excessive complexity and/or added weight to the rotorcraft.

SUMMARY

Embodiments described herein provide for detecting the angle of a cable attached to a rotorcraft for transporting a payload using a pair of linear displacement sensors that are coupled to both the rotorcraft and the cable. The linear displacement sensors can be easily retro-fitted to the rotorcraft and the cable to allow for a low cost and reliable indication of the relative angle of the cable with respect to the rotorcraft. Unlike cameras or complicated ball joints, linear displacement sensors are of low complexity and add little weight to the rotorcraft. Further, linear displacement sensors are not impacted by low visibility conditions, such as fog, rain, dust, etc.

One embodiment comprises a cable angle detector that is configured to mount to an underside of a rotor craft, where a cable has a first end coupled to the rotorcraft and a second end coupled to a payload. The cable angle detector includes a first linear displacement sensor that has a first end coupled to the underside of the rotorcraft and a second end coupled to the cable. The detector further includes a second linear displacement sensor that has a first end coupled to the underside of the rotorcraft and a second end coupled to the cable. The detector further includes a controller that is configured to measure a first displacement of the first sensor, to measure a second displacement of the second sensor, and to calculate an angle of the cable relative to the rotorcraft that is based on the first displacement and the second displacement.

Another embodiment is a method of monitoring a cable having a first end coupled to a rotorcraft and a second end coupled to a payload. The method comprises measuring a first displacement of a first linear displacement sensor that has a first end coupled to an underside of a rotorcraft and a second end coupled to a cable. The method further comprises measuring a second displacement of a second linear displacement sensor that has a first end coupled to the underside of the rotorcraft and a second end coupled to the cable. The method further comprises calculating an angle of the cable relative to the rotorcraft based on the first displacement and the second displacement.

Another embodiment comprises a cable angle detector that is configured to mount to an underside of a rotorcraft, where a cable has a first end coupled to the rotorcraft that defines an origin for a first axis and a second axis that is perpendicular to the first axis, and where the cable has a second end coupled to a payload. The cable angle detector includes a first linear displacement sensor that has a first end coupled to the underside of the rotorcraft along the first axis at a first-offset from the origin, and a second end coupled to the cable. The detector further includes a second linear displacement sensor that has a first end coupled to the underside of the rotorcraft along the second axis at a second-offset from the origin, and a second end coupled to the cable. The detector further includes a controller that is configured to measure a first displacement of the first sensor, to measure a second displacement of the second sensor, and to calculate an angle of the cable relative to the rotorcraft based on the first displacement, the first-offset, the second displacement, and the second-offset.

The features, functions, and advantages that have been discussed can be achieved independently in various embodiments or may be combined in yet other embodiments further details of which can be seen with reference to the following description and drawings.

DESCRIPTION OF THE DRAWINGS

Some embodiments are now described, by way of example only, and with reference to the accompanying drawings. The same reference number represents the same element or the same type of element on all drawings

DESCRIPTION

The figures and the following description illustrate specific exemplary embodiments. It will thus be appreciated that those skilled in the art will be able to devise various arrangements that, although not explicitly described or shown herein, embody the principles described herein and are included within the contemplated scope of the claims that follow this description. Furthermore, any examples described herein are intended to aid in understanding the principles of the disclosure, and are to be construed as being without limitation. As a result, this disclosure is not limited to the specific embodiments or examples described below, but by the claims and their equivalents.

Figure 1:
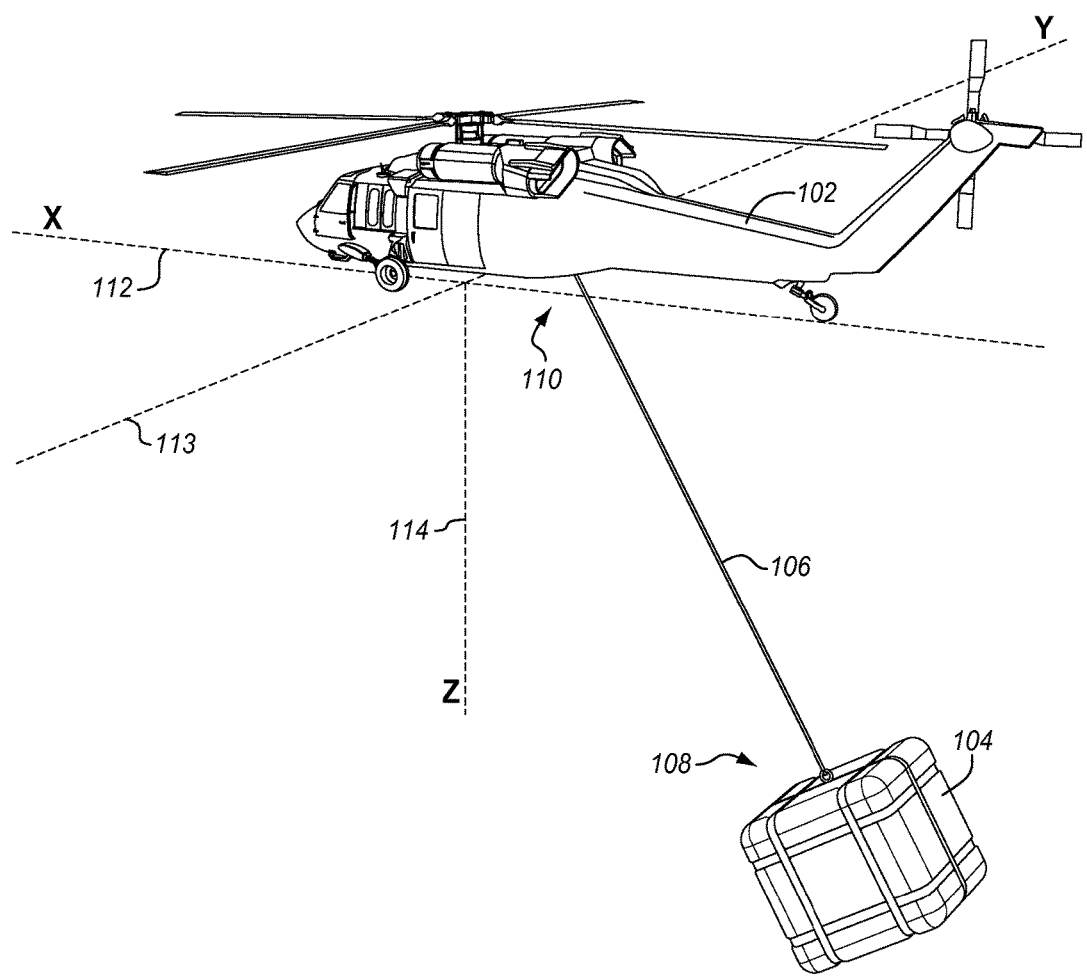
FIG. 1 is an illustration of a rotorcraft transporting a hanging payload utilizing a cable in an exemplary embodiment.

FIG. 1 is an illustration of a rotorcraft 102 transporting a payload 104 utilizing a cable 106 in an exemplary embodiment. Although rotorcraft 102 is illustrated as a helicopter in FIG. 1, one skilled in the art will recognize that rotorcraft 102 is not limited to helicopters. For instance, rotorcraft 102 may include any rotary-wing aircraft that utilizes rotors to generate lift. Some examples of rotary-wing aircraft include duocopters, quadcopters, etc. Further rotorcraft 102 may include unmanned embodiments as a matter of design choice.

One problem with transporting hanging loads using rotary-wing aircraft is that the load may sway during flight, which can generate airframe stress on the aircraft. Compensating for sway during flight may also cause the aircraft to consume more fuel, due to corrections. Under extreme circumstances, sway may render the aircraft uncontrollable, which may lead to a crash. Because a load is hanging from the aircraft during flight, the load may sway for/aft, starboard/port, or in complex combinations of any of these possibilities.

In FIG. 1, cable 106 has one end coupled to rotorcraft 102 at location 110 and another end 108 coupled to a payload 104. FIG. 1 also illustrates a number of axes 112-114 of reference that will be used in subsequent discussions. In this embodiment, axes 112-114 include an x-axis 112, a y-axis 113, and a z-axis 114. The particular orientation and labeling of axes 112-114 is arbitrary in FIG. 1 and is provided for purposes of discussion. Further, the x, y, and z Cartesian coordinates illustrated in FIG. 1 are just one example of a coordinate system that may be used.

Figure 2:
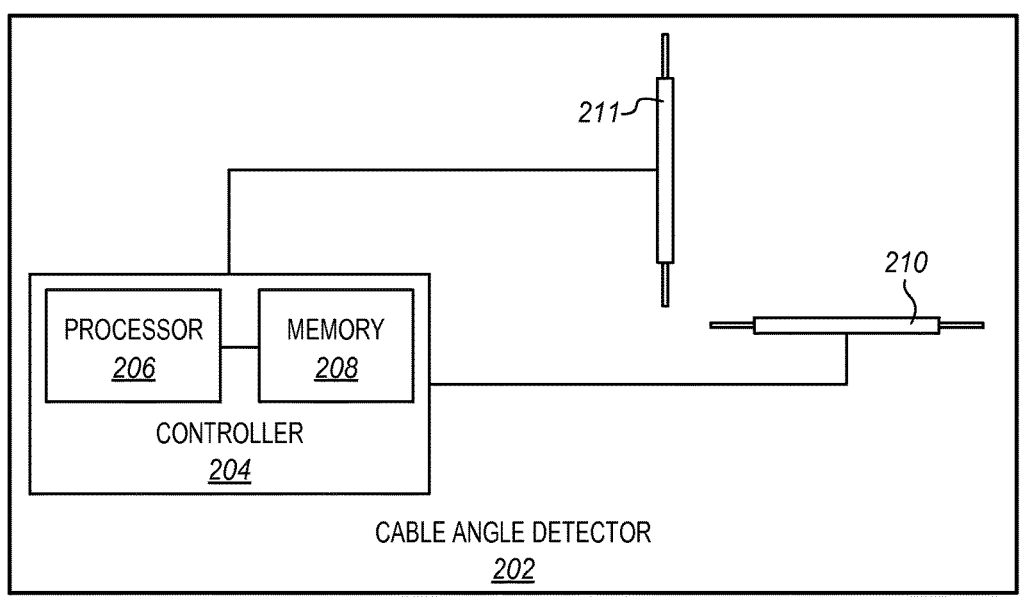
FIG. 2 is a schematic diagram of a cable angle detector in an exemplary embodiment.

FIG. 2 is a schematic diagram of a cable angle detector 202 in an exemplary embodiment. In this embodiment, detector 202 includes a controller 204 and a pair of linear displacement sensors 210-211. Generally, sensors 210-211 are used to measure a distance between two points. Sensors 210-211 may measure a distance between two points by varying in resistance (e.g., if sensors 210-211 are linear potentiometers or string potentiometers), although the particular manner in which sensors 210-211 measure a distance between two points may be a design choice. Controller 204 may include one or more processors 206 (e.g., Intel Atom, Intel Core 2 Duo, Cortex-A9, etc.). Controller 204 may also include memory 208 (e.g., Static Random Access Memory, Flash, Electrically Erasable Read Only Memory, etc.) in order to execute programmed instructions for implementing the functionality described herein for controller 204.

Figure 3:
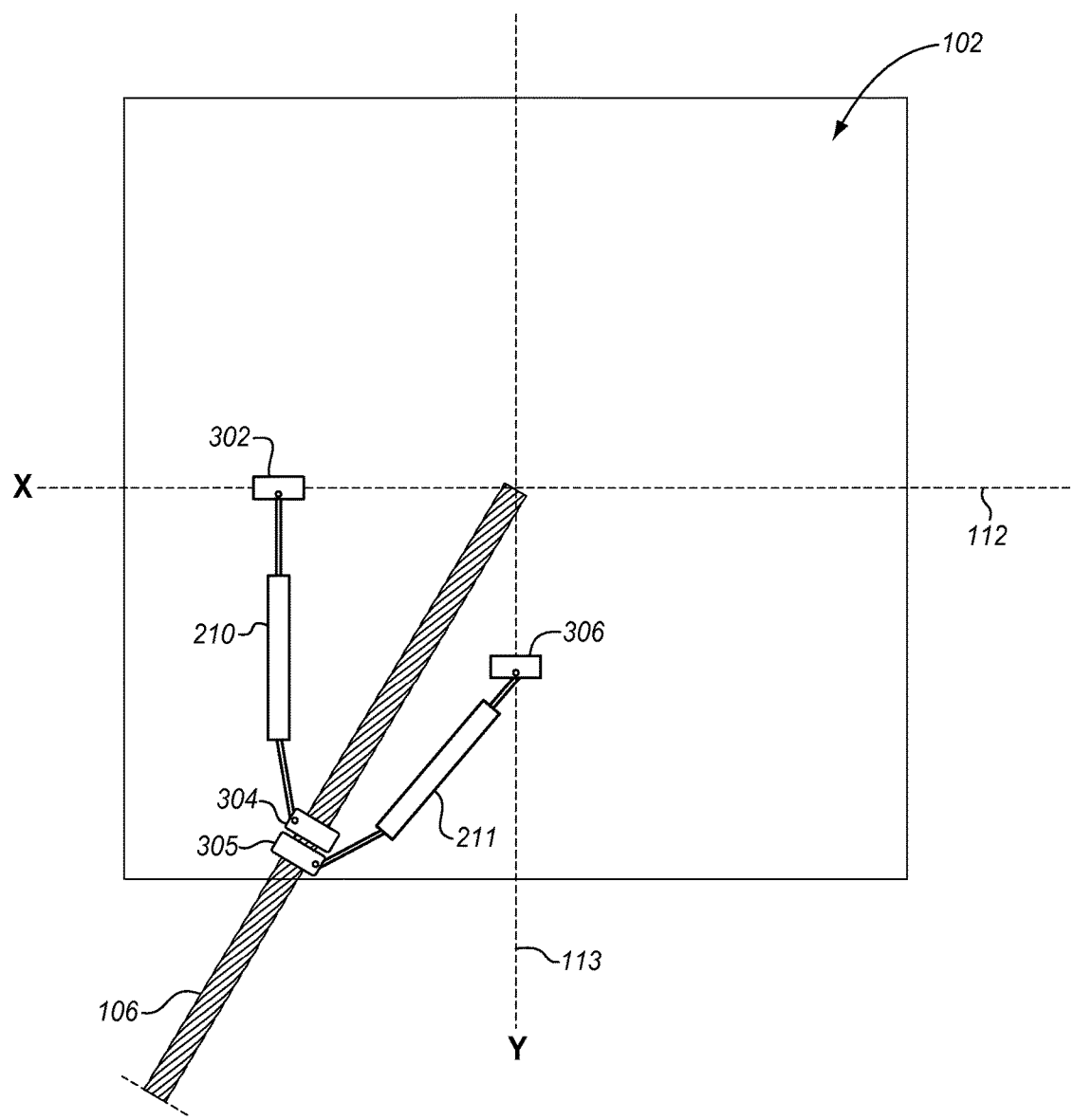
FIG. 3 is an illustration of a bottom view of a rotorcraft having a cable angle detector mounted to the underside in an exemplary embodiment.

FIG. 3 is an illustration of a bottom view of rotorcraft 102 having detector 202 mounted to the underside in an exemplary embodiment. In this embodiment, sensor 210 is coupled to the underside of rotorcraft 102 at mounting location 302 and coupled to cable 106 at mounting location 304. Mounting location 302 may include a ring attachment or some other type of feature that may be affixed to rotorcraft 102. Sensor 210 is used to measure a distance between location 302 and location 304. Sensor 211 is coupled to the underside of rotorcraft 102 at mounting location 306 and is coupled to cable 106 at location 305. Similar to mounting location 302, location 306 may be a ring attachment or some other type of feature that may be affixed to rotorcraft 102. In some embodiments, detector 202 may include a specialized adapter plate the mounts to the underside of rotorcraft 102. Sensors 210-211 may then mount to the adapter plate rather than the underside of rotorcraft 102. Locations 304-305 where sensors 210-211 coupled to cable 106 may be a common mounting location in some embodiments.

In this embodiment, sensor 210 is coupled to rotorcraft 102 along x-axis 112 and sensor 211 is coupled to rotorcraft 102 along y-axis 113, which is perpendicular to x-axis 112. X-axis may lie in a direction of flight of rotorcraft 102, along a major length of rotorcraft 102, etc. Y-axis 113 may then be substantially perpendicular to x-axis 112. Further, both x-axis 112 and y-axis 113 are in the same plane along the bottom surface of rotorcraft 102.

When rotorcraft 102 is in flight, payload 104 may move in a number of different ways, which is analyzed in real-time or near-real time by controller 204 based on how the lengths of sensors 210-211 change over time.

Figure 4:
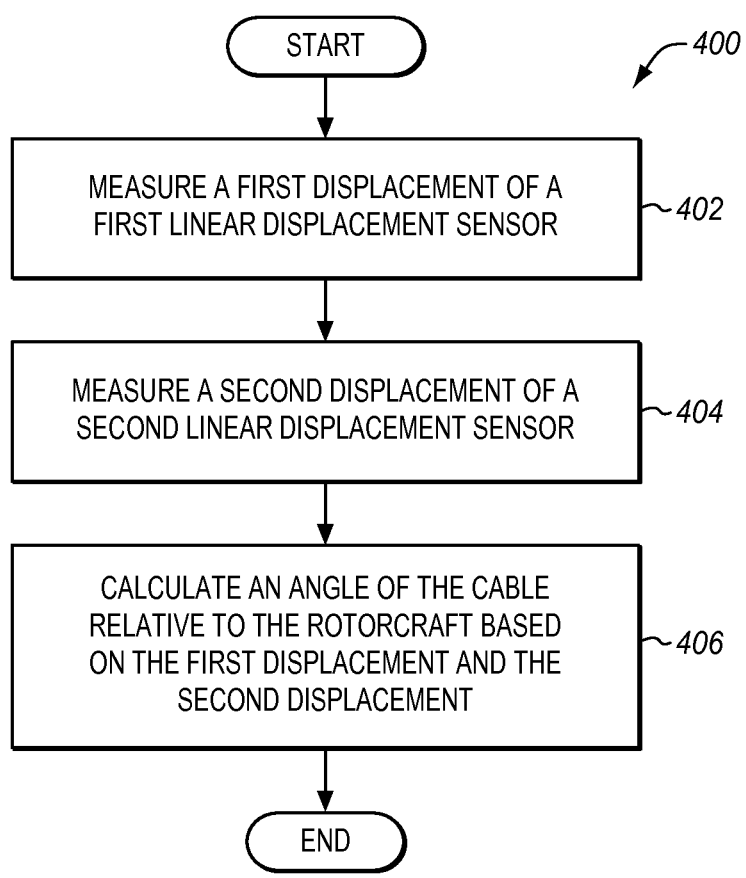
FIG. 4 is a flow chart of a method of monitoring a cable having a first end coupled to a rotorcraft and a second end coupled to a payload in an exemplary embodiment.

FIG. 4 is a flow chart of a method 400 of monitoring a cable having a first end coupled to a rotorcraft and a second end coupled to a payload in an exemplary embodiment. The steps of method 400 will be described with respect to detector 202 of FIG. 2, although one skilled in the art will understand that the methods described herein may be performed by other devices or systems not shown. The steps of the methods described herein are not all inclusive and may include other steps not shown.

When rotorcraft 102 is transporting payload 104, one or more angles between cable 106 and rotorcraft 102 will change over time. For instance, cable 106 may have an x-axis 112 component angle and a y-axis 114 component angle with respect to rotorcraft 102. In order to determine how payload 104 is moving over time, controller 204 measures the displacement of sensors 210-211 and calculates an angle of cable 106 supporting payload 104 based on the displacement, which depends in part on the geometric relationship between sensors 210-211, cable 106, and rotorcraft 102. In order to discuss a geometric relationship between the various elements of FIG. 3, a more simplified view of FIG. 4 will be discussed.

Figure 5:
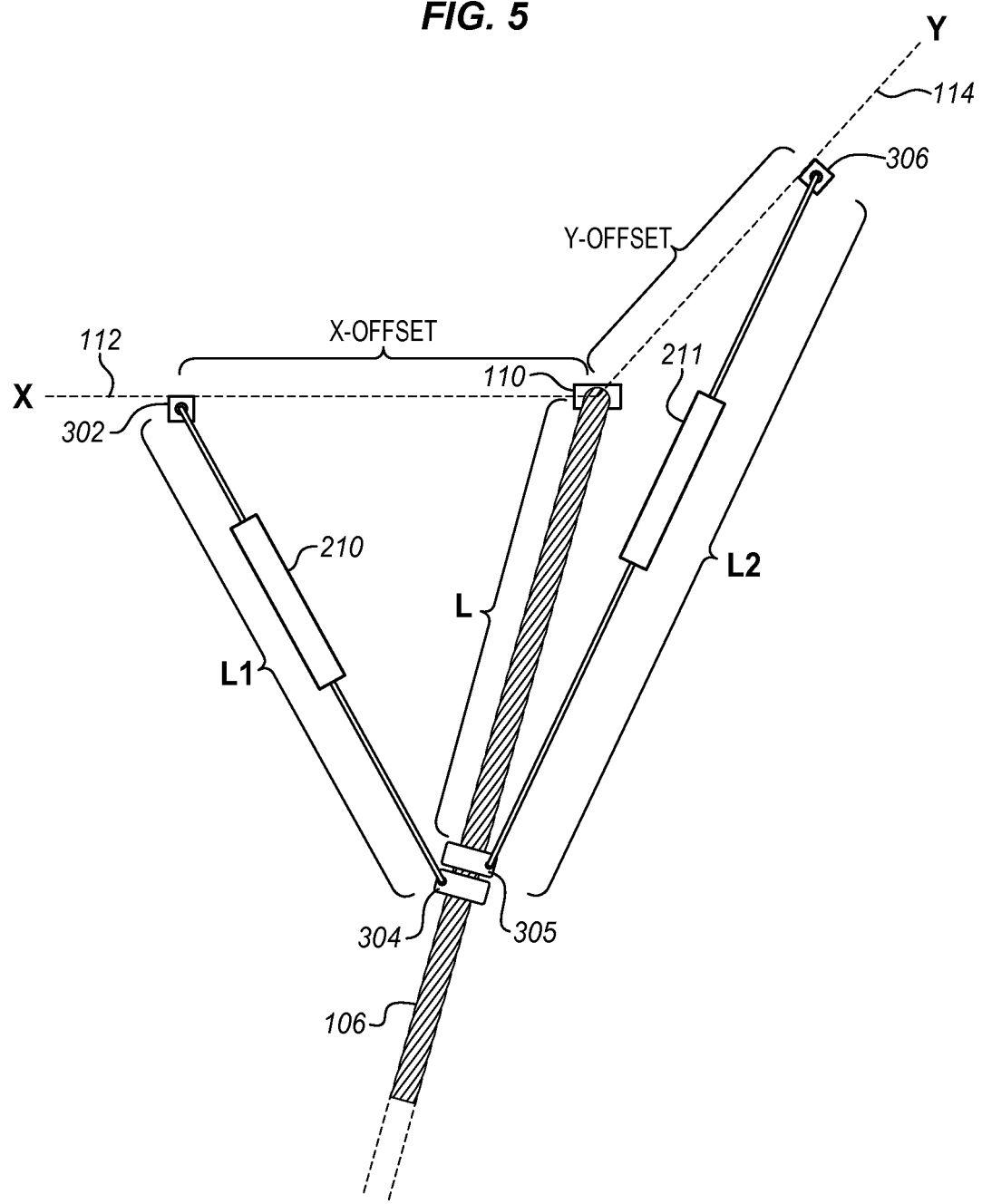
FIG. 5 is a simplified view of the geometry of the partial bottom view of FIG. 3 in an exemplary embodiment.

FIG. 5 is a simplified view of the geometry of the bottom view of FIG. 3 in an exemplary embodiment. In this view, a length L1 measured by sensor 210 is a distance between where sensor 210 mounts to rotorcraft 102 and where sensor 210 mounts to cable 106. Because sensor 210 mounts to rotorcraft 102 along x-axis 112, an x-offset is shown, which is a distance between where sensor 210 mounts to rotorcraft 102 and where cable 106 mounts to rotorcraft 102.

A length L2 measured by sensor 211 in this view is a distance between where sensor 211 mounts to rotorcraft 102 and where sensor 211 mounts to cable 106. Because sensor 211 mounts to rotorcraft 102 along y-axis 114, a y-offset is shown, which is a distance between where sensor 211 mounts to rotorcraft 102 and where cable 106 mounts to rotorcraft 102. Also illustrated in this view is a length L, which is a distance between where sensors 210-211 mount to cable 106 and where cable 106 mounts to rotorcraft 102. The relationships between L, L1, L2, the x-offset, and the y-offset result in a particular geometric relationship, which may be used along with the time varying values of L1 and L2 in order to calculate angle information for cable 106.

During flight of rotorcraft 102, cable 106 may be moving in almost any direction. This results in L1 and L2 changing over time. Controller 204 measures a displacement L1 of sensor 210 (see step 402 of FIG. 4), and measures a displacement L2 of sensor 211 (see step 404 of FIG. 4). Controller then calculates an angle of cable 106 that is relative to rotorcraft 102 based on L1 and L2. In some cases, correction factors may be utilized along with L1 and L2 to correlate L1 and L2 to the particular geometry that exists for sensors 210-211, cable 106, and rotorcraft 102. These correction factors may therefore account for the x-offset, the y-offset, and L that are illustrated in FIG. 5. In other embodiments, controller 102 may utilize L, L1, L2, x-offset and y-offset values to calculate a three dimensional vector for cable 106 in real time. Either the angle of cable 106 or the vector information of cable 106 may be provided to a flight control system of rotorcraft 102 in some embodiments. The information may be used by the flight control system to adjust the orientation of rotorcraft 102 in flight to minimize or reduce the sway of load 104 during transport.

One example of a three dimensional coordinates system that may be used to calculate a vector for cable 106 is a spherical coordinate system. Consider the following example. First, an initial geometry of FIG. 5 may be calculated by controller 204. Assume for the example that P1 is a point in Cartesian coordinates where cable 106 mounts to rotorcraft 102. This will be taken as the origin in this example, or [0,0,0]. Further assume that P2 is a point in Cartesian coordinates where sensor 210 mounts to rotorcraft 102. This will be [(x-offset),0,0]. The x-offset arises due to the distance between where cable 106 mounts to rotorcraft 102 and where sensor 210 mounts to rotorcraft 102 along x-axis 112.

P3 is a point in Cartesian coordinates where sensor 211 mounts to rotorcraft 102. This will be [0,(y-offset),0]. The y-offset arises due to the distance between where cable 106 mounts to rotorcraft 102 and where sensor 211 mounts to rotorcraft 102 along y-axis 114. For this geometric example, both sensors 210-211 are mounted to rotorcraft 102 in the same z plane as the origin P1, resulting in z=0.

Next controller 204 calculates orthogonal unit vectors that lie along the plan formed by P1-P3, with P1 as the origin. The unit vector for x (êx) would be [P2−P1]/ABS[P2−P1]. The component of p3−p1 along unit vector êx (i) would be the dot product of êx and [P3−P1]. The unit vector y (êy) is ([P3−P1]−i*êx)/ABS(P3−P1−i*êx). The unit vector z (êz) is the cross product of êx and êy. The distance between P1 and P2 (d) is ABS[P2−P1]. The component of P3−P1 along êy (j) would be the dot product of êy and (P3−P1).

Now that the initial geometry is calculated, controller 204 may calculate a vector of cable 106 in Cartesian coordinates in real time using L1 of sensor 210, L2 of sensor 211, and L. First, controller 204 measures L1 and L2. Then, the x, y, and z components are calculated. The x component is (L*L−L1*L1+d*d)/2*d). The y component is (L*L−L2*L2+i*i+j*j)/(2*j)−(i/j)*x. The z component is the square root of (L*L−x*x−y*y). Where sensors 210-211 mount to cable 106 at locations 304-305 is PMEAS, which is calculated as P1+x*êx+y*êy+z*êz. The load angle in spherical coordinates may then be calculated knowing these Cartesian coordinates. The angle phi is the arccosine of (PMEAS[3])/L), and the angle theta is the arctangent of (PMEAS[2], PMEAS[1]). This allows for a vector to be calculated for the location on cable 106 where sensors 210-211 mount to cable 106. If a length of cable 106 is known, a vector for payload 104 may be calculated based on PMEAS and the length of cable 106. This calculation along with a weight of payload 104 may be used by the flight control system to adjust the orientation of rotorcraft 102 in flight to minimize or reduce the sway of load 104 during transport.

A number of advantages exist when utilizing detector 202 to determine the angle(s) of a cable used to transport a payload. One advantage is that detector 202 is not subject to visibility issues that may cause a camera based system to fail. Another advantage is that detector 202 may easily be retrofitted to rotary-wing aircraft, and detector 202 would be less complicated and lighter than either a camera based system or a ball-joint based system. In addition, because sensors 210-211 are not in line with payload 104, sensors 210-211 are not subjected to the weight of payload 104 as would a ball-joint based system.

Another advantage is that multiple sensors may be utilized to provide redundancy and/or additional measurement accuracy. For example, each of sensors 210-211 may comprise multiple sensors mounted in parallel with each other between rotorcraft 102 and cable 106. If any particular sensor failed, other sensors in parallel with the failed sensor would be available to provide fault tolerance. In addition, multiple sensors in parallel may be measured and the measurements filtered (e.g. utilizing a Kalman filter, or Linear Quadratic Estimation (LQE) filter) to improve the measurement accuracy over a single sensor measurement.

Any of the various elements shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments were described herein, the scope is not limited to those specific embodiments. Rather, the scope is defined by the following claims and any equivalents thereof.

The invention claimed is:

1. An apparatus comprising:
a cable angle detector configured to mount to an underside of a rotorcraft, wherein a cable has a first end coupled to the rotorcraft and a second end coupled to a payload, the cable angle detector including:
a first linear displacement sensor having a first end coupled to the underside of the rotorcraft and a second end coupled to the cable;
a second linear displacement sensor having a first end coupled to the underside of the rotorcraft and a second end coupled to the cable; and
a controller configured to measure a first displacement of the first sensor, to measure a second displacement of the second sensor, and to calculate an angle of the cable relative to the rotorcraft based on the first displacement and the second displacement.

2. The apparatus of claim 1 wherein:
the first end of the first sensor is coupled to the underside of the rotorcraft along a first axis; and
the first end of the second sensor is coupled to the underside of the rotorcraft along a second axis that is perpendicular to the first axis.

3. The apparatus of claim 1 wherein:
the second end of the first sensor and the second end of the second sensor are coupled to the cable at a common location.

4. The apparatus of claim 1 further comprising:
an adapter plate mounted to the rotorcraft;
wherein the first end of the first sensor and the first end of the second sensor are coupled to the adapter plate.

5. The apparatus of claim 1 wherein:
the controller is configured to provide the angle of the cable to a flight system of the rotorcraft for adjusting an orientation of the rotorcraft in flight.

6. The apparatus of claim 1 wherein:
the controller is configured to calculate a position of the payload relative to the rotorcraft based on the angle of the cable.

7. The apparatus of claim 1 wherein:
the first sensor and the second sensor comprise at least one of a linear potentiometer and a string potentiometer.

8. The apparatus of claim 1 wherein:
the rotorcraft comprises an Unmanned Air Vehicle (UAV).

9. A method of monitoring a cable having a first end coupled to a rotorcraft and a second end coupled to a payload, the method comprising:
measuring a first displacement of a first linear displacement sensor having a first end coupled to an underside of the rotorcraft and a second end coupled to the cable;
measuring a second displacement of a second linear displacement sensor having a first end coupled to the underside of the rotorcraft and a second end coupled to the cable; and
calculating an angle of the cable relative to the rotorcraft based on the first displacement and the second displacement.

10. The method of claim 9 wherein:
the first end of the first sensor is coupled to the underside of the rotorcraft along a first axis;
the first end of the second sensor is coupled to the underside of the rotorcraft along a second axis that is perpendicular to the first axis; and
calculating the angle further comprises:
calculating the angle based on an orientation of the first sensor along the first axis and an orientation of the second sensor along the second axis.

11. The method of claim 9 wherein:
the second end of the first sensor and the second end of the second sensor are coupled to the cable at a common location.

12. The method of claim 9 further comprising:
providing the angle of the cable to a flight system of the rotorcraft for adjusting an orientation of the rotorcraft in flight.

13. The method of claim 9 further comprising:
calculating a position of the payload relative to the rotorcraft based on the angle of the cable.

14. An apparatus comprising:
a cable angle detector configured to mount to an underside of a rotorcraft, wherein a cable has a first end coupled to the rotorcraft that defines an origin for a first axis and a second axis that is perpendicular to the first axis, wherein the cable has and a second end coupled to a payload, the cable angle detector including:
a first linear displacement sensor having a first end coupled to the underside of the rotorcraft along the first axis at a first-offset from the origin, wherein the first linear displacement sensor has a second end coupled to the cable;
a second linear displacement sensor having a first end coupled to the underside of the rotorcraft along the second axis at a second-offset from the origin, wherein the second linear displacement sensor has a second end coupled to the cable; and
a controller configured to measure a first displacement of the first sensor, to measure a second displacement of the second sensor, and to calculate an angle of the cable relative to the rotorcraft based on the first displacement, the first-offset, the second displacement, and the second-offset.

15. The apparatus of claim 14 wherein:
the second end of the first sensor and the second end of the second sensor are coupled to the cable at a common location.

16. The apparatus of claim 14 further comprising:
an adapter plate mounted to the rotorcraft;
wherein the first end of the first sensor and the first end of the second sensor are coupled to the adapter plate.

17. The apparatus of claim 14 wherein:
the controller is configured to provide the angle of the cable to a flight system of the rotorcraft for adjusting an orientation of the rotorcraft in flight.

18. The apparatus of claim 14 wherein:
the controller is configured to calculate a position of the payload relative to the rotorcraft based on the angle of the cable.

19. The apparatus of claim 14 wherein:
the first sensor and the second sensor comprise at least one of a linear potentiometer and a string potentiometer.

20. The apparatus of claim 14 wherein:
the rotorcraft comprises an Unmanned Air Vehicle (UAV).

* * * * *